(12) United States Patent
Liao

(10) Patent No.: US 6,179,919 B1
(45) Date of Patent: *Jan. 30, 2001

(54) APPARATUS FOR PERFORMING CHEMICAL VAPOR DEPOSITION

(75) Inventor: Kuan-Yang Liao, Taipei (TW)

(73) Assignee: United Silicon Incorporated, Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/076,364

(22) Filed: May 11, 1998

(30) Foreign Application Priority Data

Mar. 7, 1998 (TW) ................................. 87103360

(51) Int. Cl.[7] .................................................. C23C 16/00
(52) U.S. Cl. ............................................................ 118/715
(58) Field of Search ................................... 118/715, 728, 118/733

(56) References Cited

U.S. PATENT DOCUMENTS

| 5,024,182 | * | 6/1991 | Kobayashi et al. | 118/715 |
| 5,567,243 | * | 10/1996 | Foster et al. | 118/730 |
| 5,735,960 | * | 4/1998 | Sandhu et al. | 118/723 IR |
| 5,900,064 | * | 5/1999 | Kholodenko | 118/723 R |
| 5,985,378 | * | 11/1999 | Paquet | 427/562 |

FOREIGN PATENT DOCUMENTS

19532435 * 3/1997 (DE) .

* cited by examiner

Primary Examiner—Jeff H. Aftergut
(74) Attorney, Agent, or Firm—Jiawei Huang; J C Patents

(57) ABSTRACT

An apparatus and a method for performing chemical vapor deposition. The apparatus includes a plasma generator for dissociating source gases into atomic or ionic states, and a laminar flow reaction chamber connected to the plasma generator for depositing the dissociated atoms or ions. The apparatus and method utilizes the capacity of plasma to deposit thin films at a lower temperature combined with the capacity of a laminar flow chemical vapor deposition method to deposit a conformable layer.

2 Claims, 1 Drawing Sheet

APPARATUS FOR PERFORMING CHEMICAL VAPOR DEPOSITION

CROSS-REFERENCE TO RELATED APPLICATION

This application claims the priority benefit of Taiwan application serial no. 87103360, filed Mar. 7, 1998, the full disclosure of which is incorporated herein by reference.

BACKGROUND OF THE INVENTION

1. Field of Invention

The present invention relates to an apparatus and method for performing a chemical vapor deposition. More particularly, the present invention relates to an apparatus and method capable of performing a chemical vapor deposition at a lower reacting temperature.

2. Description of Related Art

Chemical vapor deposition (CVD) is a technique for forming a solid thin film on a substrate by the chemical reaction of one or a few types of gaseous reactants. Because most common participating gaseous reactants are fluid, fluid flow phenomena affect the performance of a CVD reaction.

Laminar flow and turbulent flow are the two most commonly observed fluid motions. The speed and direction of flow of the former is smooth while that of the latter is non-uniform and chaotic. In general, when the diameter of a pipe in which a fluid moves through is wide, or the speed of flow is high, the fluid will flow in a turbulent mode. However, turbulent motion of the gaseous reactants is highly undesirable for chemical vapor deposition. This is because a turbulent flow will stir up micro particles or dust particles within the reaction chamber so that final quality of the deposited film is adversely affected. Therefore, most CVD equipment design tends to incorporate a smooth laminar flow section in its reaction chamber so that reaction stability is maintained.

Generally, if the flow of gaseous reactants in a CVD process is laminar, a higher deposition temperature must be used. A higher temperature not only increases power consumption of the CVD equipment, but also can easily damage silicon chip structure causing reliability problems, especially when a high temperature is used in the later part of the manufacturing cycle. Alternatively, a deposition process capable of being performed at a lower temperature, such as a plasma-enhanced chemical vapor deposition (PECVD) method, can be used. However, it is difficult for a PECVD method to deposit a smooth and uniform thin film over a substrate. In other words, the deposited thin film lacks conformability.

In light of the foregoing, there is a need to provide a better apparatus and method for carrying out chemical vapor deposition.

SUMMARY OF THE INVENTION

Accordingly, the present invention is to provide an apparatus and method for depositing a thin film over a substrate. The method utilizes plasma, which can be used to deposit CVD film at a lower temperature, combined with a laminar flow for carrying out a chemical vapor deposition so that the resulting film layer is more conformable. To achieve these and other advantages and in accordance with the purpose of the invention, as embodied and broadly described herein, the invention provides an apparatus and method for carrying out chemical vapor deposition (CVD). The apparatus comprises a plasma generator for dissociating source gases into an atomic or ionic form, and a laminar CVD chamber connected to the plasma generator for depositing the dissociated atoms or ions. The method of carrying out the chemical vapor deposition comprises the steps of first dissociating source gases into an atomic or ionic form using a plasma generator. Next, the atoms or ions flow through the reaction chamber with very high velocity and are allowed to deposit onto a substrate using a laminar flow chemical vapor deposition.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serves to explain the principles of the invention. In the drawing.

DESCRIPTION OF THE PREFERRED EMBODIMENTS

Figure 1:
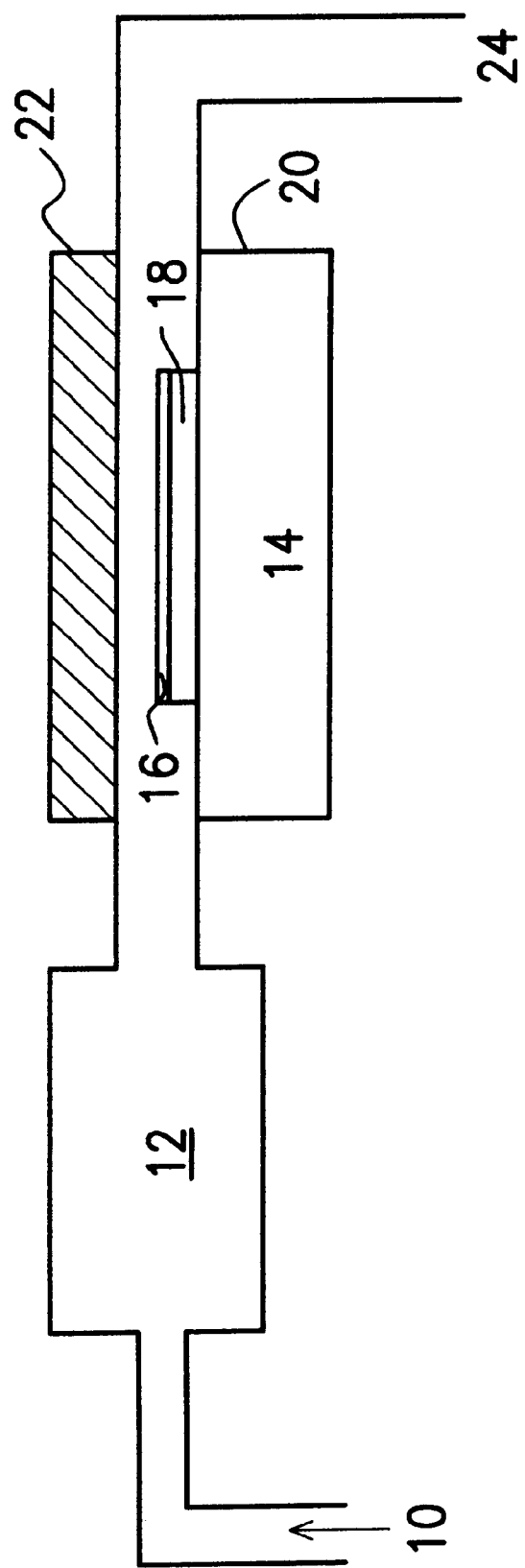
FIG. 1 is a diagram showing the apparatus for performing chemical vapor deposition according to the preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram showing the apparatus for performing chemical vapor deposition according to the preferred embodiment of this invention.

Before deposition is actually carried out, gaseous source reactants for thin film deposition composed of a single or a mixture of gases 10 is first passed into a plasma generator 12. The plasma generator 12 can be, for example, a high-density plasma (HDP) generator, microwave generator, radio frequency (RF) generator or inductive-coupled plasma (ICP) generator.

After the source gases 10 pass through the plasma generator 12, the source gases 10 dissociate into their respective atomic or ionic states. Thereafter, the dissociated atoms or ions are fed into a laminar flow reaction chamber 14. The gas flow passage of the laminar flow reaction chamber 14 is deliberately quite narrow. This is because with a narrow passageway, a laminar flow can be sustained in the reaction chamber 14 and a high quality thin film 16 is able to form over a wafer 18. Since the source gases have already dissociated after passing through the plasma generator 12, reacting temperature within the reaction chamber 14 can be reduced. Furthermore, when the reaction chamber temperature is low, the depositing rate of the dissociated reactive gases can be higher. Therefore, depositing time can be shortened and the throughput can be increased.

In general, the deposition temperature for an oxide layer is in the range of 600–900° C. However, using the apparatus of this invention, the deposition temperature can be reduced to about 400° C. For the deposition of a high dielectric constant material such as tantalum pentoxide ($Ta_2O_5$), the normal deposition temperature is in the range of 300–400°

C. Using this invention, the deposition temperature of tantalum pentoxide can be even lower.

In addition, if the chamber walls 20 and the top ceiling 22 of the laminar reacting chamber 14 are maintained at a temperature below that of the silicon wafer 18, thin film will not be deposited on the chamber walls 20 and the ceiling 22. Consequently, the laminar reacting chamber will be free from unwanted deposition, which can block the passageway and impede the wafer deposition process.

Finally, the laminar flow reaction chamber 20 is connected to a pump or an exhaust pipe 24 for disposal.

The combination of plasma generator 12 and laminar flow chamber 14 can provide very high conformality CVD film depositing at low temperature (<400° C.).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for performing chemical vapor deposition, the apparatus comprises:
    a plasma generator, to dissociate a gas source for thin film deposition into respective atomic or ionic states;
    a reaction chamber, for disposing a wafer therein for thin film deposition and to receive the dissociated gas source fed from the plasma generator, the reaction chamber further comprising:
        a plurality of chamber walls; and
        a top ceiling, wherein a passageway between the top ceiling and a surface of the wafer is narrow enough to form a laminar flow of the dissociated gas source; and
    a pump, connected to an output of the reaction chamber.

2. The apparatus as claimed in claim 1, wherein a temperature of the chamber walls and the top ceiling of the reaction chamber is lower than a temperature of the wafer during thin film deposition.

\* \* \* \* \*